(12) United States Patent
Chang et al.

(10) Patent No.: US 10,908,634 B1
(45) Date of Patent: Feb. 2, 2021

(54) SYSTEMS AND METHODS FOR PARALLEL PHOTONIC COMPUTING

(71) Applicant: Luminous Computing, Inc., Menlo Park, CA (US)

(72) Inventors: Matthew Chang, Menlo Park, CA (US); Mitchell A. Nahmias, Menlo Park, CA (US)

(73) Assignee: Luminous Computing, Inc., Menlo Park, CA (US)

( * ) Notice: Subject to any disclaimer, the term of this patent is extended or adjusted under 35 U.S.C. 154(b) by 0 days.

(21) Appl. No.: 16/923,557

(22) Filed: Jul. 8, 2020

Related U.S. Application Data

(60) Provisional application No. 63/018,971, filed on May 1, 2020, provisional application No. 62/871,337, filed on Jul. 8, 2019.

(51) Int. Cl.
| | |
|---|---|
| *G06E 1/00* | (2006.01) |
| *G06E 1/04* | (2006.01) |
| *H03F 3/45* | (2006.01) |
| *G02B 6/42* | (2006.01) |
| *G02B 6/293* | (2006.01) |

(52) U.S. Cl.
CPC ............ *G06E 1/04* (2013.01); *G02B 6/2938* (2013.01); *G02B 6/29301* (2013.01); *G02B 6/4215* (2013.01); *H03F 3/45475* (2013.01); *H03F 2200/129* (2013.01); *H03F 2203/45528* (2013.01)

(58) Field of Classification Search
CPC .................. G06E 1/04; H03F 3/45475; H03F 2203/45528; H03F 2200/129; G02B 6/4215; G02B 6/2938; G02B 6/29301; G02F 3/00
USPC ........................................................ 359/107
See application file for complete search history.

(56) References Cited

PUBLICATIONS

Miller et al., "Large-scale optical phased array using a low-power multi-pass silicon photonic platform", vol. 7, No. 1 / Jan. 2020 / Optica.

*Primary Examiner* — William R Alexander
*Assistant Examiner* — Henry A Duong
(74) *Attorney, Agent, or Firm* — Jeffrey Schox; Samuel Rosenthal

(57) ABSTRACT

A system for parallel photonic computation, preferably including one or more source modules, a plurality of multiplication modules, and a plurality of summation modules. In one embodiment, each multiplication module can include a set of input modulators, a splitter, and a plurality of multiplication banks. Each summation module can include one or more detectors. Each summation module preferably receives an output from multiple multiplication modules and computes the sum of all channels of all the received outputs. A method for parallel photonic computation, preferably including generating input signals, computing products, and computing sums.

20 Claims, 17 Drawing Sheets

SYSTEMS AND METHODS FOR PARALLEL PHOTONIC COMPUTING

CROSS-REFERENCE TO RELATED APPLICATIONS

This application claims the benefit of U.S. Provisional Application Ser. No. 62/871,337, filed on 8 Jul. 2019, and U.S. Provisional Application Ser. No. 63/018,971, filed on 1 May 2020, each of which is incorporated in its entirety by this reference.

TECHNICAL FIELD

This invention relates generally to the photonic computing field, and more specifically to new and useful systems and methods for parallel photonic computing.

BACKGROUND

Typical systems and method for photonic computing can be limited in the number of operations they can perform simultaneously. Thus, there is a need in the photonic computing field to create new and useful systems and methods for parallel photonic computing.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Overview.

Figure 1A:
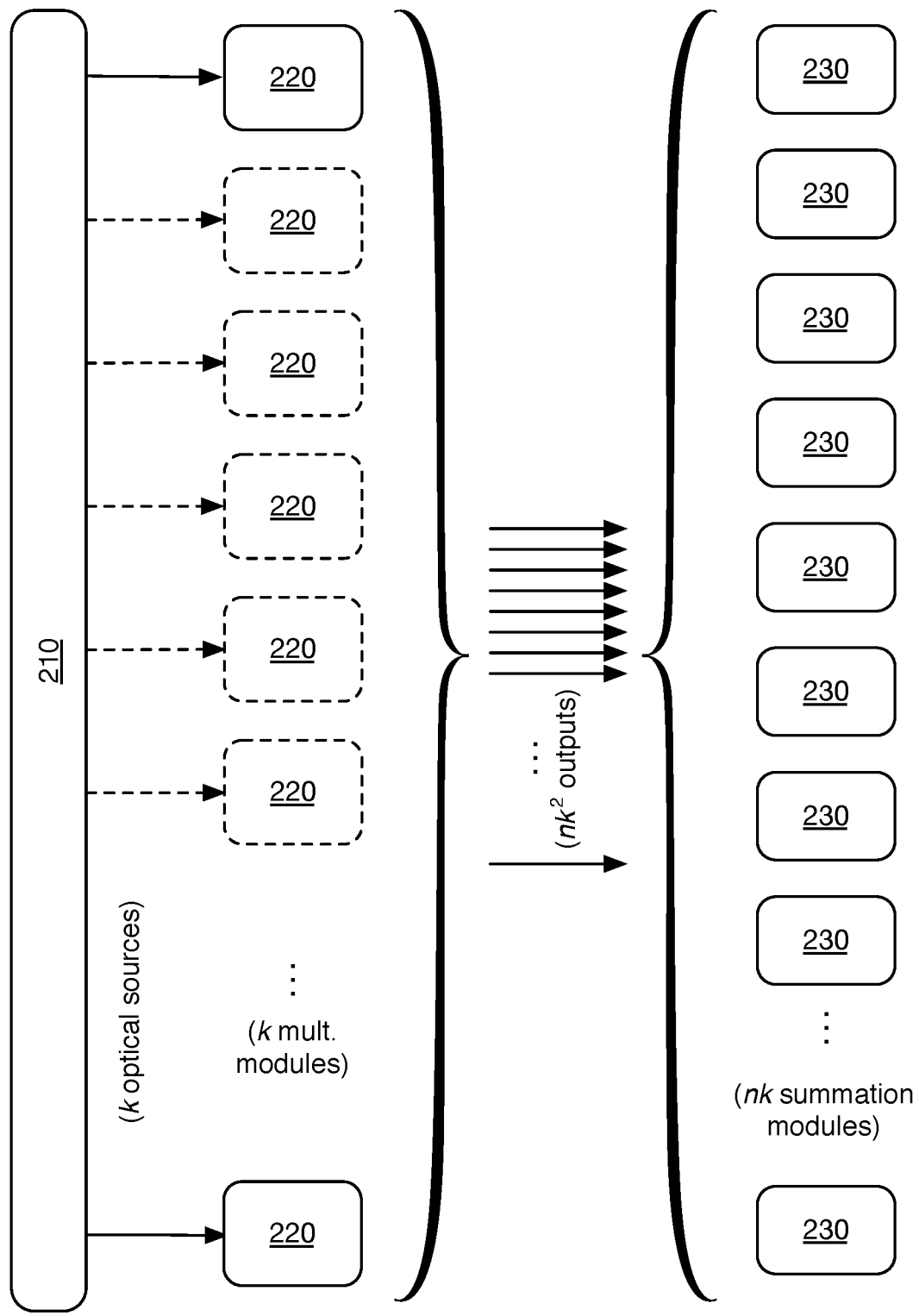
FIG. 1A is a schematic representation of an embodiment of a system for parallel photonic computing.
Figure 1B:
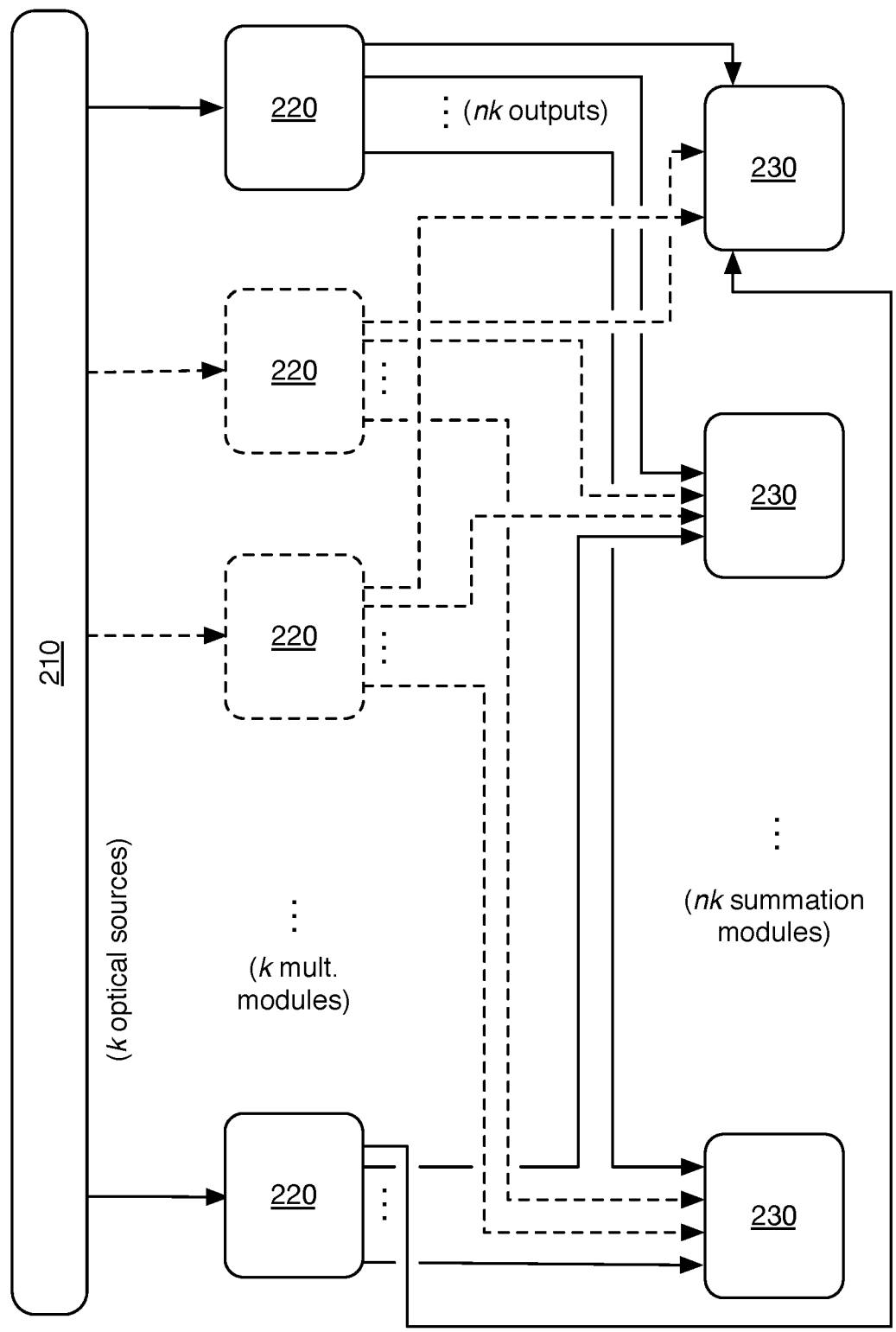
FIG. 1B is a schematic representation of a variant of the embodiment depicted in FIG. 1A.
Figure 1C:
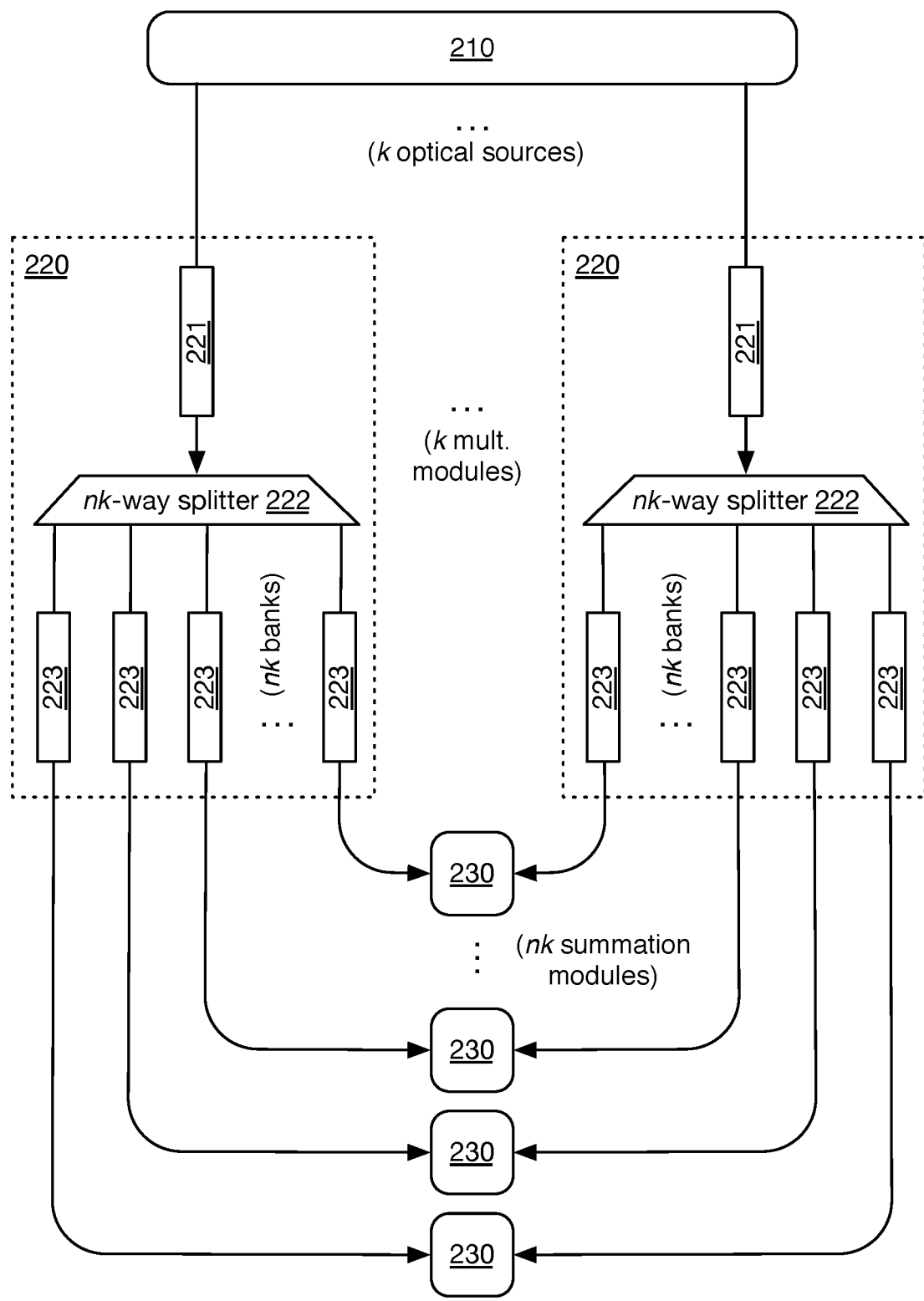
FIG. 1C is a schematic representation of a specific example of variant depicted in FIG. 1B.

A system 200 for parallel photonic computation preferably includes: a source module 210, a plurality of multiplication modules 220, and a plurality of summation modules 230 (e.g., as shown in FIGS. 1A-1C). The system can additionally or alternatively include any other suitable elements. The system can include (e.g., be made of) any suitable materials (e.g., as described in more detail in Appendix A).

Figure 8:
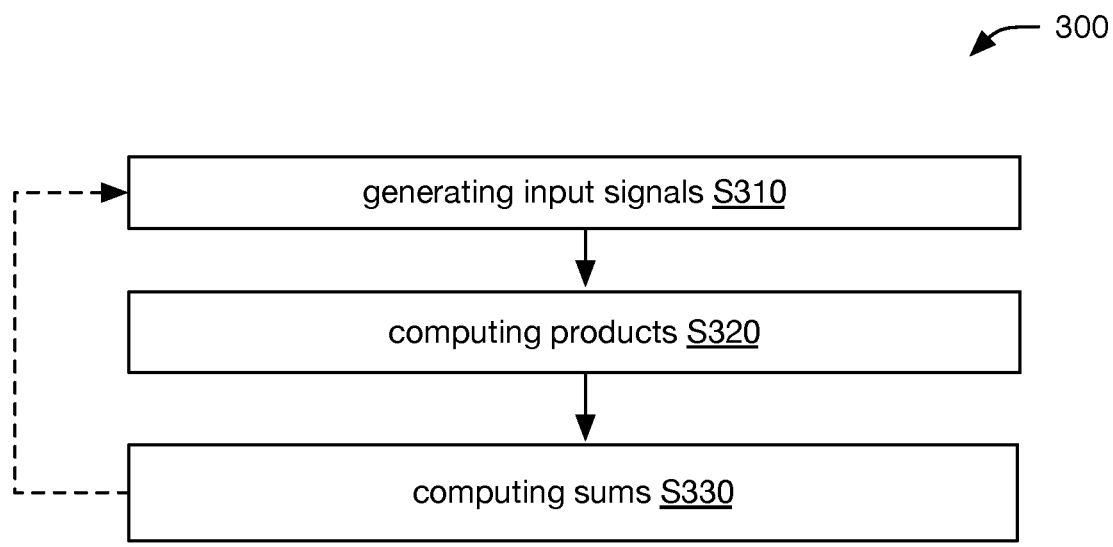
FIG. 8 is a flowchart representation of an embodiment of a method for parallel photonic computing.

A method 300 for parallel photonic computation preferably includes: generating input signals S310; computing products S320; and computing sums S330 (e.g., as shown in FIG. 8). The method can additionally or alternatively include any other suitable elements.

2. Benefits.

Embodiments of the system and/or method can confer several benefits. In some embodiments, fewer optical channels (e.g., wavelength-based channels) are required to achieve a particular degree of parallelism (e.g., a particular number of concurrent operations). Such a reduction of optical channel count can reduce the complexity of providing, modulating, and/or filtering optical signals. Such a reduction can additionally or alternatively increase the modularity and/or scalability of the system and/or method. Such a reduction can additionally or alternatively reduce optical losses associated with optical signal filtering and/or modulation (e.g., due to a reduced number of channel-specific filters and/or modulators that each optical signal interacts with during filtering and/or modulation). However, the system and/or method can additionally or alternatively confer any other suitable benefits.

3. System.

3.1 Source Module.

The source module 210 preferably functions to generate a plurality of multi-channel optical sources. The optical sources are preferably spatially-separated from each other, and are preferably substantially identical to one another. However, the multi-channel optical sources can additionally or alternatively include any other suitable optical sources. The number of different optical sources generated by the source module, k, is preferably a power of two (e.g., wherein k is equal to 2, 4, 8, 16, 32, or 64, etc.), but can alternatively include any other suitable number of optical sources (e.g., wherein k is equal to 3-6, 5-10, 10-25, 25-50, or greater than 50, etc.).

Each optical source preferably includes light of a plurality of optically-distinct channels (e.g., wavelengths, modes, etc.), such as described below in more detail. The number of channels n in each optical source is preferably much greater than the number of different optical sources k. However, n and k can alternatively have any other suitable relationship. The source module preferably includes one or more emitters (e.g., as described below in further detail). The emitters are preferably configured to collectively output multi-channel light, more preferably unmodulated light but alternatively light modulated in any suitable manner.

Figure 2A:
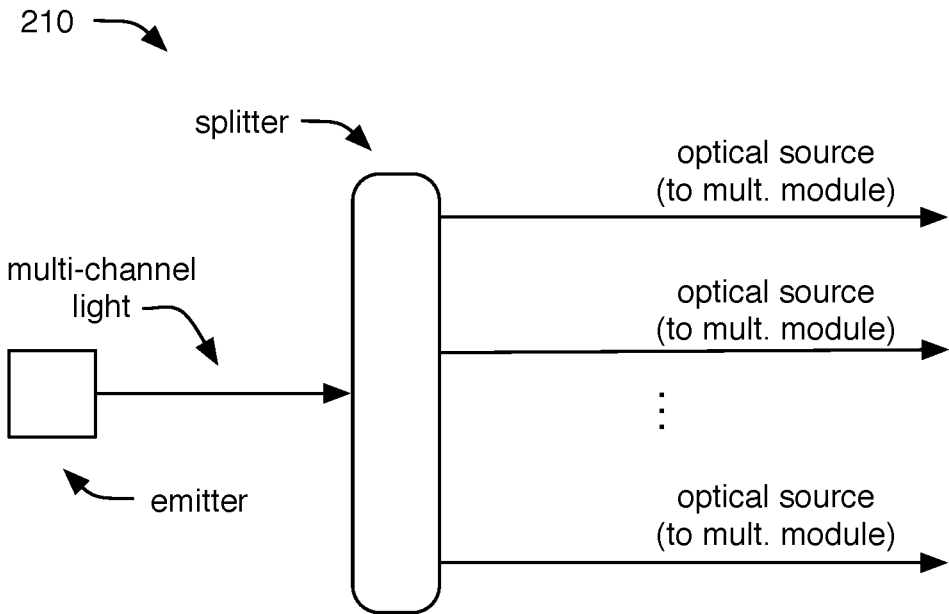
FIGS. 2A-2C are schematic representations of various embodiments of a source module of the system.
Figure 2B:
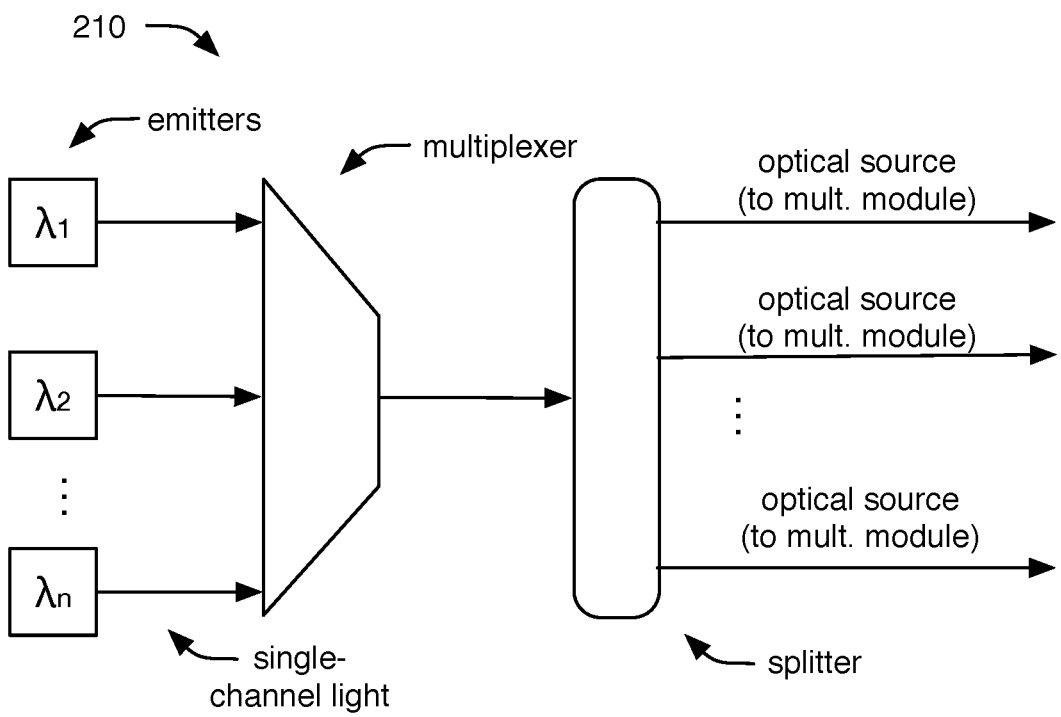
Figure 2C:
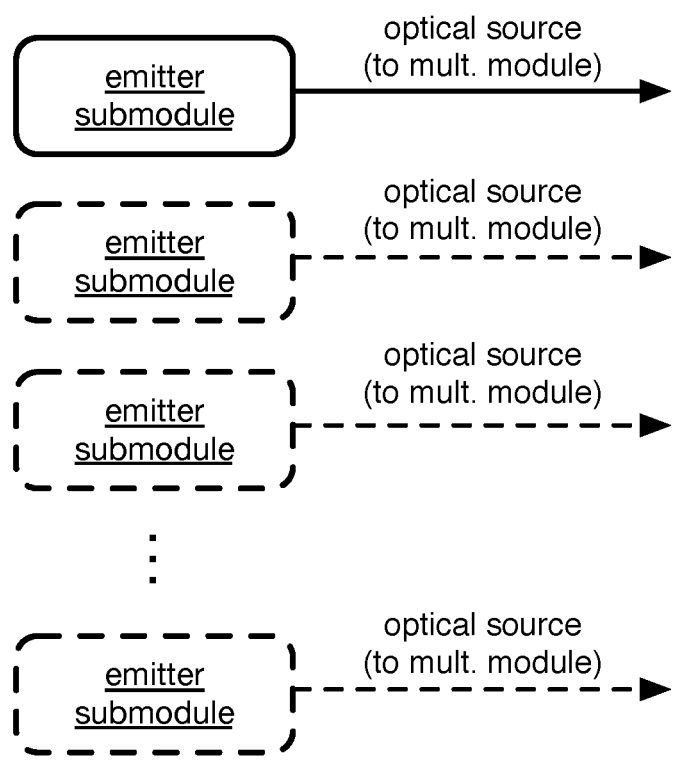

In a first embodiment, the source module 210 includes one or more emitters (e.g., single-wavelength emitters, multi-wavelength emitter(s), etc.) and/or transducers (e.g., polarizers, waveplates, mode filters and/or converters, etc.) that collectively produce light of n distinct optical channels (e.g., wavelengths), and includes a k-way splitter that splits the n-channel output into the k different optical sources. In a first example of this embodiment, the source module includes a single multi-wavelength emitter (e.g., comb laser), such as shown by way of example in FIG. 2A. In a second example of this embodiment, the source module includes n distinct single-wavelength emitters and a multiplexer that combines the outputs of the emitters into a single waveguide, such as shown by way of example in FIG. 2B. In a variation of this second example, the multiplexer and splitter are combined into a single n×k coupler that accepts n single-channel inputs and mixes them into k outputs (preferably substantially identical outputs, but alternatively outputs having any other suitable relationships, such as outputs of varying intensity). In a second embodiment, the source module 210 includes a plurality of separate (e.g., independent or substantially independent, spatially separated, having non-intersecting or non-overlapping optical paths, etc.) emitter submodules (e.g., k separate emitter submodules), each configured to emit a separate optical source (e.g., n-channel optical source), such as shown by way of example in FIG. 2C.

Each emitter is preferably a laser (e.g., diode laser, preferably a component of an integrated circuit), such as a Fabry Perot cavity laser (e.g., with multiple modes, thereby outputting light of multiple wavelengths), a mode-locked laser (e.g., gain-absorber system) configured to output light of multiple wavelengths, a distributed feedback (DFB) laser, a distributed Bragg reflector (DBR) laser, and/or a vertical cavity surface emitting laser, but can additionally or alternatively include an LED and/or any other suitable light emitter. In some examples, an emitter (e.g., DFB laser emitting a single wavelength, DBR laser emitting multiple wavelengths, etc.) can be coupled to (output light to) one or more modulators (e.g., Mach-Zehnder modulators), wherein the modulators are driven by one or more varying (e.g., oscillating) signals, thereby generating additional optical channels.

The multiplexer preferably functions to combine multiple optical signals (e.g., channels) onto a single output path (e.g., a waveguide), such as for wavelength-division multiplexing (WDM). The multiplexer is preferably an optical multiplexer, such as an arrayed waveguide grating (AWG), but can additionally or alternatively be any other suitable multiplexer.

However, the source module 210 can additionally or alternatively include any other suitable elements in any suitable arrangement.

In some embodiments, the plurality of channels can be differentiated based on wavelength, such as wherein the channels include different channels near (e.g., within a threshold distance of, substantially centered around, etc.) the 1.3 micron and/or 1.55 micron wavelength (e.g., within the 1.26-1.36 micron O-band, within the 1.53-1.565 micron C-band and/or the 1.565-1.625 micron L-band, etc.), wherein the wavelengths described herein preferably refer to the wavelength the light would have in free space, rather than to the wavelength of the light in the medium through which it is propagating. The wavelength channels are preferably narrow-band channels, such as channels of less than a threshold bandwidth (e.g., 1, 2, 5, 10, 15, 25, 40, 65, 100, 200, 500, 1000 GHz, 1-5, 5-20, 20-100, 100-300, and/or 300-1000 GHz frequency bandwidth; 0.01, 0.02, 0.05, 0.1, 0.2, 0.5, 1, 2, 5, 10, 0.01-0.05, 0.05-0.2, 0.2-1, 1-3, or 3-10 nm spectral bandwidth; etc.), but can additionally or alternatively include intermediate- and/or wideband channels and/or channels of any other suitable widths.

The light of the channels of the optical source preferably has a bandwidth significantly narrower than the width of the associated channel, such as narrower by at least a threshold relative amount (e.g., less than 0.01, 0.03, 0.1, 0.2, 0.3. 0.4, 0.5, 0.001-0.01, 0.01-0.1, 0.1-0.3, 0.3-0.5, or more than 0.5 times the width of the associated channel, etc.) and/or absolute amount (e.g., 0.1, 0.2, 0.5, 1, 2, 5, 10, 15, 20, 30, 40, 50, 75, 100, 150, 250, 0.1-1, 1-5, 5-15, 15-45, 45-100, or 100-300 GHz, etc.), more preferably wherein the light is farther than a threshold amount (e.g., 0.25-1 times the threshold amounts described above) from either edge of the associated channel. The light is preferably substantially centered within the associated channel (e.g., within a threshold amount of the center, such as 0.25-1 times the threshold amounts described above), but can alternatively be located at any other suitable location within the channel. In one example, the light has a linewidth less than a first threshold amount (e.g., 0.3, 1, 3, 10, 30, 100, 300, 1000, 3000, 0.3-3, 3-300, and/or 300-10,000 MHz, etc.). However, the light can additionally or alternatively occupy any other suitable amount of the spectrum.

The channels are preferably non-overlapping, more preferably having at least (and/or at most) a threshold spacing (e.g., threshold amount relative to the channel width, such as 5, 10, 25, 50, 100, 110, 125, 150, 175, 200, 250, 300, 400, 500, 0-1, 1-5, 5-15, 15-30, 30-60, 60-100, 100-110, 110-120, 120-150, 150-200, 200-300, or 300-500% of the channel width; absolute threshold amount, such as 0.1, 0.2, 0.5, 1, 2, 5, 10, 15, 20, 30, 40, 50, 75, 100, 150, 250, 0.1-1, 1-5, 5-15, 15-45, 45-100, or 100-300 GHz; etc.) between each other (e.g., center-to-center distance, edge-to-edge distance, etc.). However, all or some of the channels can alternatively be overlapping (e.g., by no more and/or no less than a threshold amount, such as described above regarding the threshold spacing) and/or have any other suitable relationship to each other. The channels and/or emitters can be indexed based on wavelength (e.g., from shortest to longest wavelength, such as channel 1 being associated with the shortest wavelength, channel 2 being associated with the second shortest wavelength, etc.).

The channels can additionally or alternatively be associated with optical modes (e.g., transverse spatial modes, polarization modes, etc.). This can include, for example, using different spatial modes (e.g., higher-order TE modes, such as wherein the optical signals are originally in the $TE_0$ mode) and/or polarizations (e.g., TE and TM modes); in such examples, the waveguide into which the multi-channel signal is coupled is preferably a multi-mode waveguide (e.g., waveguide configured to support all of the outputs to be coupled into it).

However, the channels can additionally or alternatively include any other suitable optical channels, such as channels associated with any other suitable optical characteristics.

3.2 Multiplication Modules.

The multiplication modules 220 preferably function to perform analog multiplications for computing a vector-matrix product (e.g., the product of an input vector and a multiplier matrix). The system preferably includes k total multiplication modules, wherein each multiplication module (MM) receives one of the k optical sources. Each MM preferably receives a multi-channel (e.g., n-channel) optical source (e.g., received from the source module), a plurality of input values (multiplicands, such as activations), preferably n input values, and a matrix of multiplier values (e.g., values of an n×nk matrix). The multiplicands can be received as electrical signals (e.g., provided to an electro-optical modulator), as optical signals (e.g., provided to an optical remodulator, such as a remodulator that transduces an optical signal into an electrical signal, optionally modifies the signal in the electrical domain, such as via a non-linear transformation, and then transduces the electrical signal into an optical signal), and/or in any other suitable format. In alternate embodiments, a modulated multi-channel optical input can be used in place of both the optical source and the input modulators described below (e.g., wherein the multi-channel optical input is provided directly to downstream elements of the multiplication module). The multiplier values (e.g., weight values) are preferably received as electrical signals, but can alternatively be received as optical signals or signals of any other suitable format.

Each multiplication module preferably outputs a plurality of spatially-separated optical outputs (e.g., nk outputs). Each output is preferably a multi-channel (e.g., n-channel) optical signal, wherein each channel of the signal is preferably representative an individual element-element product, associated with a single multiplicand and a single multiplier (e.g., represented as a value associated with the channel, such as the optical intensity of the light of the channel). Accordingly, the multi-channel signal can be associated with (e.g., representative of) an output value equal to the sum the individual element-element products associated with each channel of the signal (e.g., equal to the sum of intensities of the light of the channels). However, the optical outputs can have any other suitable form.

Figure 3A:
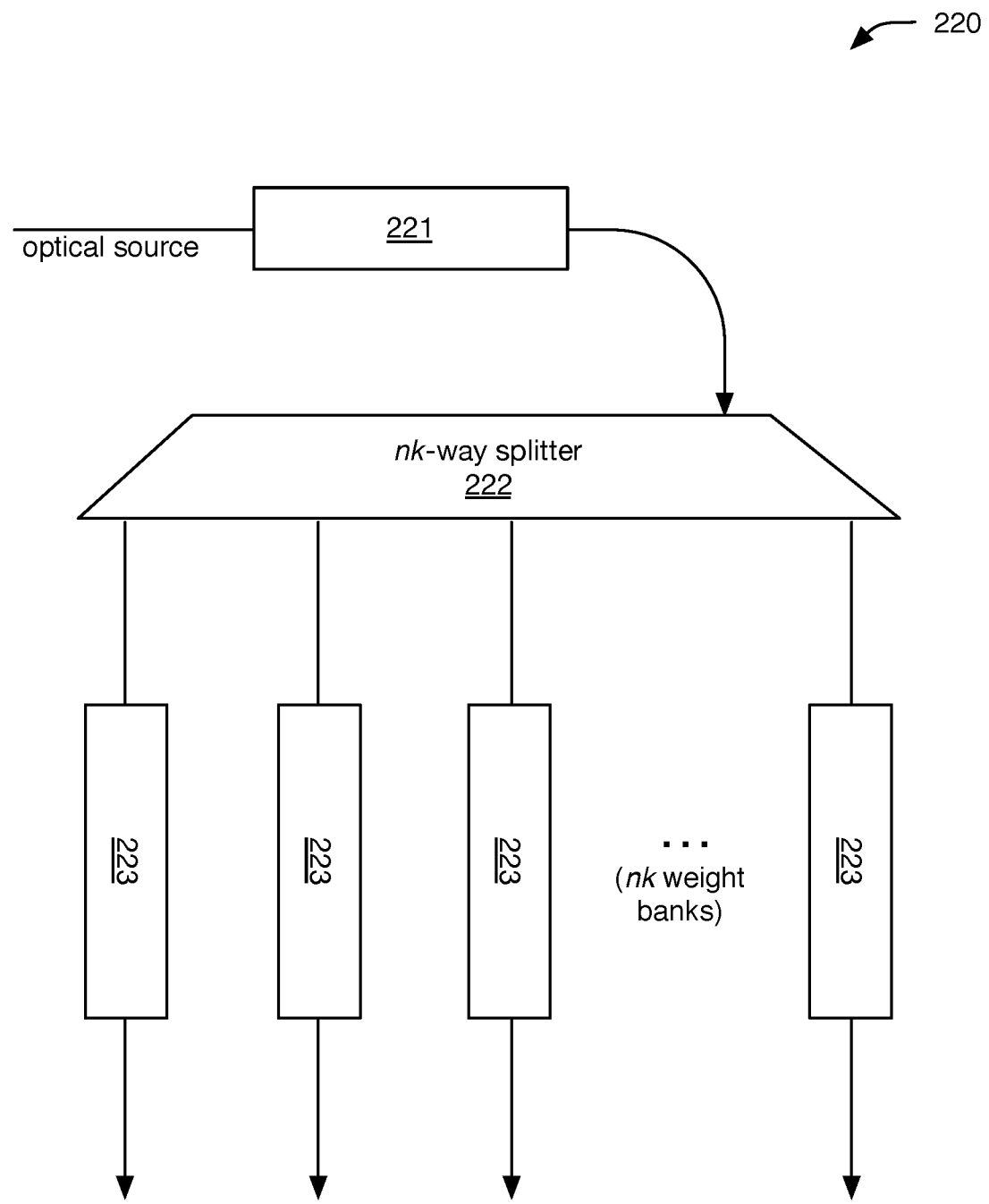
FIG. 3A is a schematic representation of an embodiment of a multiplication module of the system.
Figure 3B:
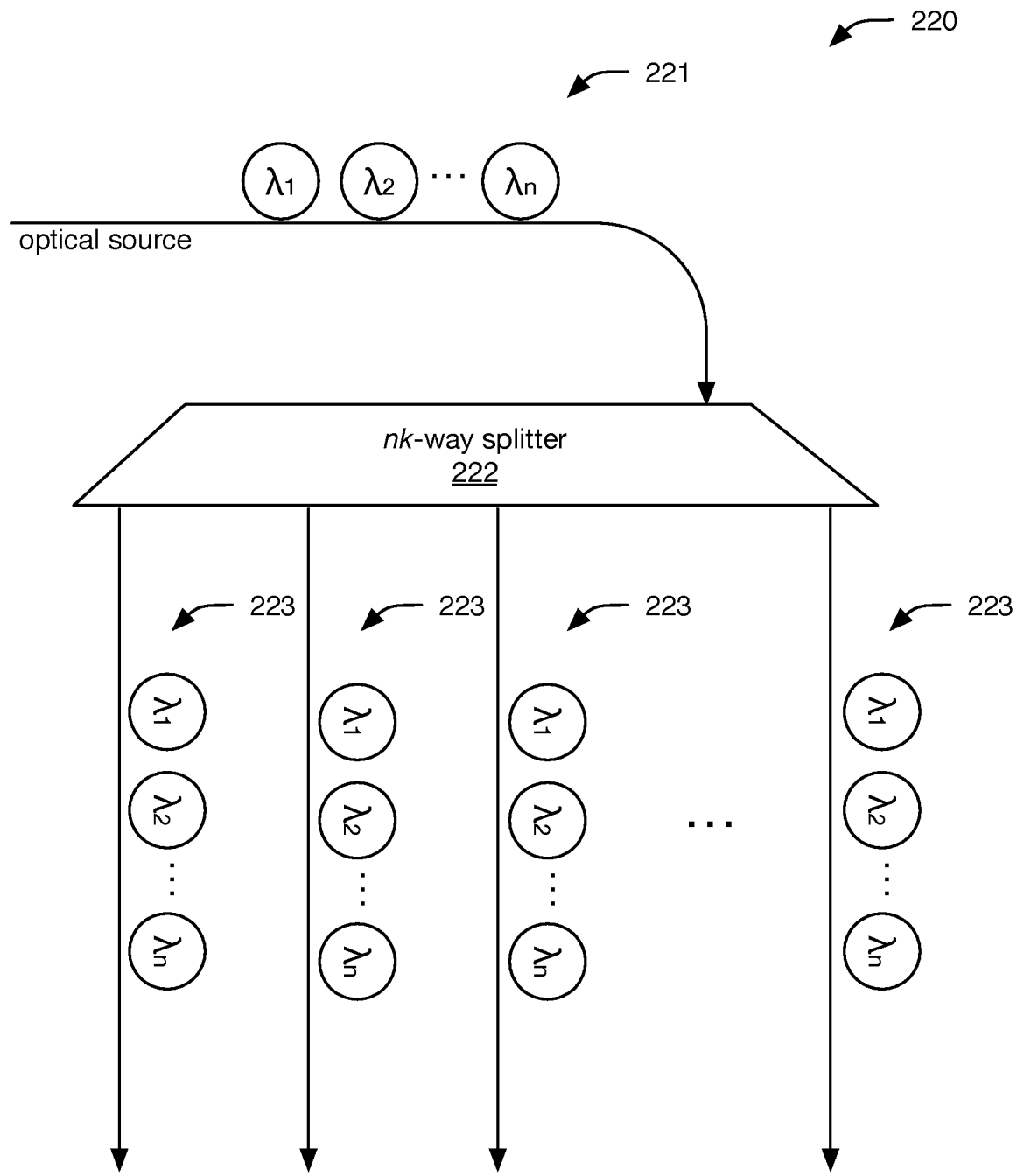
FIGS. 3B-3C are schematic representations of a first and second example, respectively, of the embodiment of FIG. 3A.
Figure 3C:
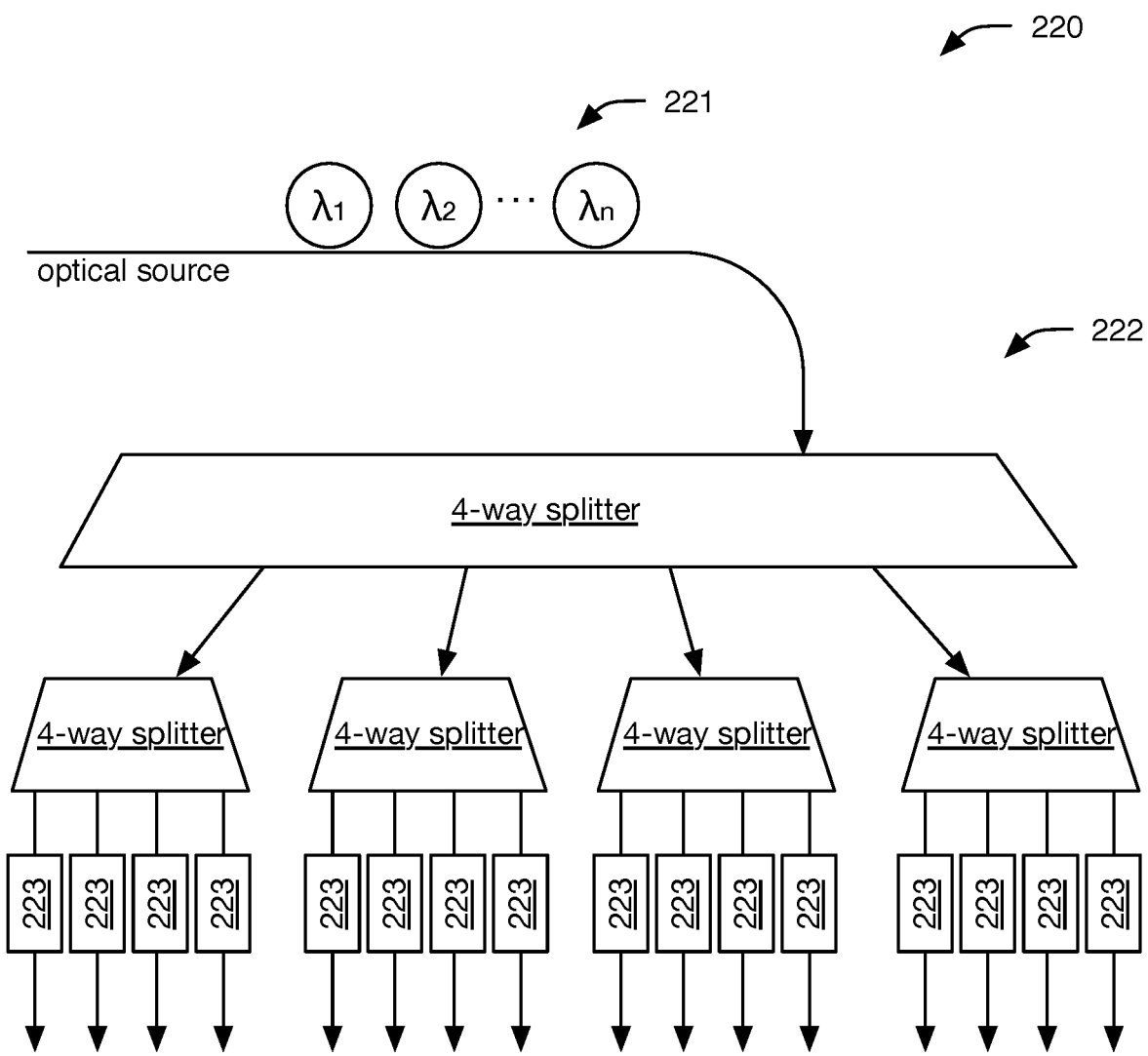

In one embodiment, each multiplication module 220 can include a set of input modulators 221, a splitter 222, and a plurality of multiplication banks 223 (e.g., as shown by way of examples in FIGS. 3A-3C).

Figure 4:
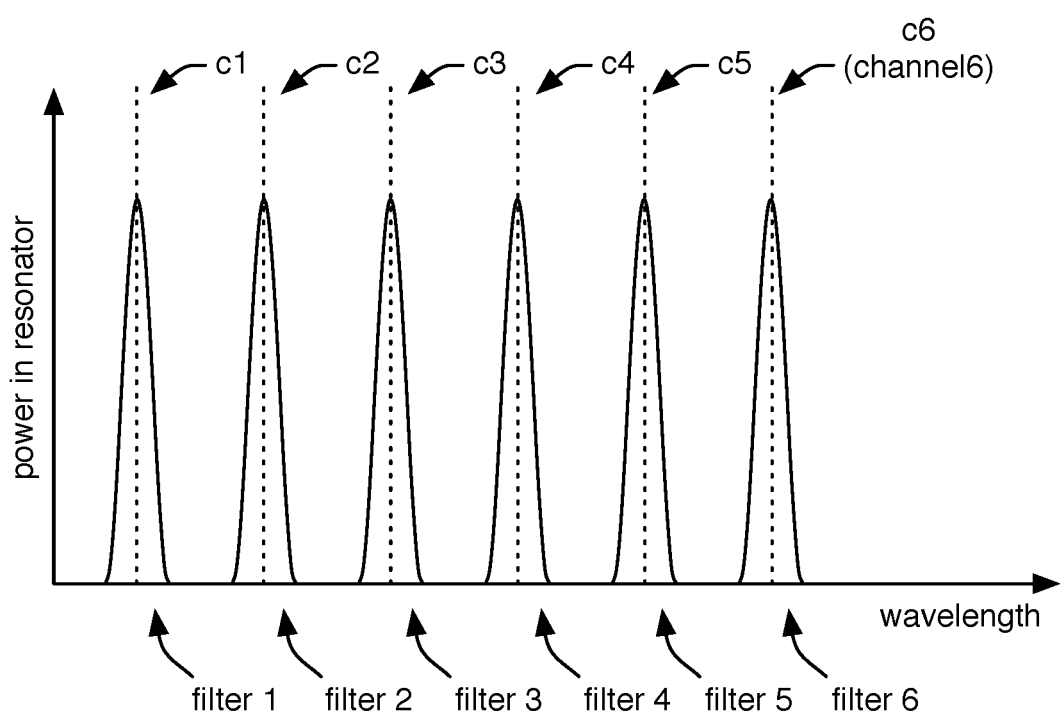
FIG. 4 is a representation of optical channels and filter resonances of an example of the system.
Figure 5A:
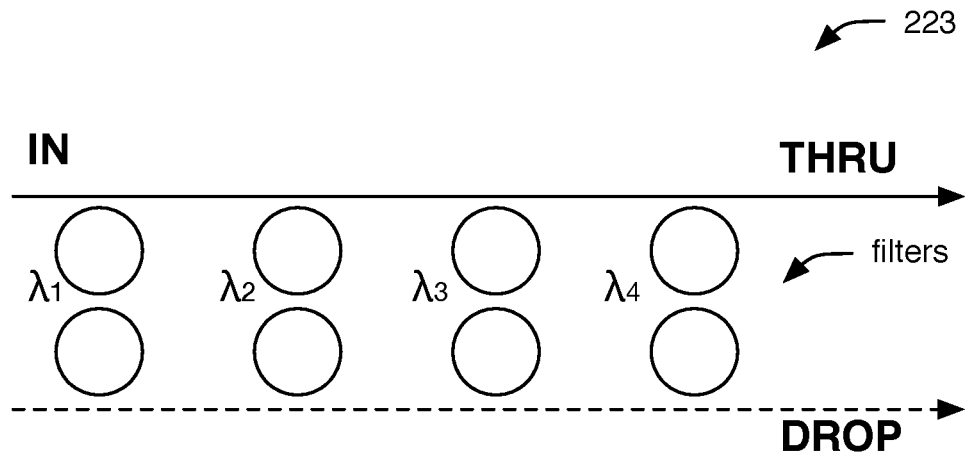
FIGS. 5A-5D are schematic representations of various examples of a multiplication bank of the system.
Figure 5B:
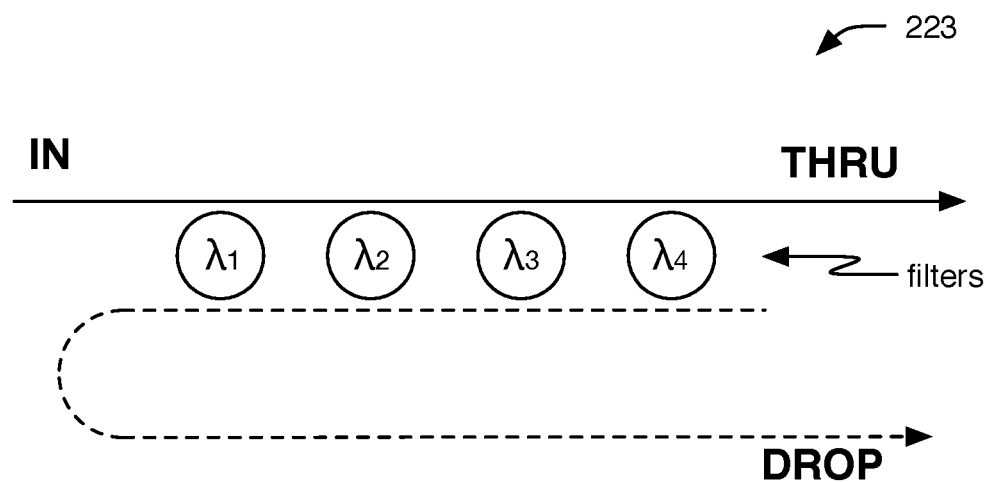
Figure 5C:
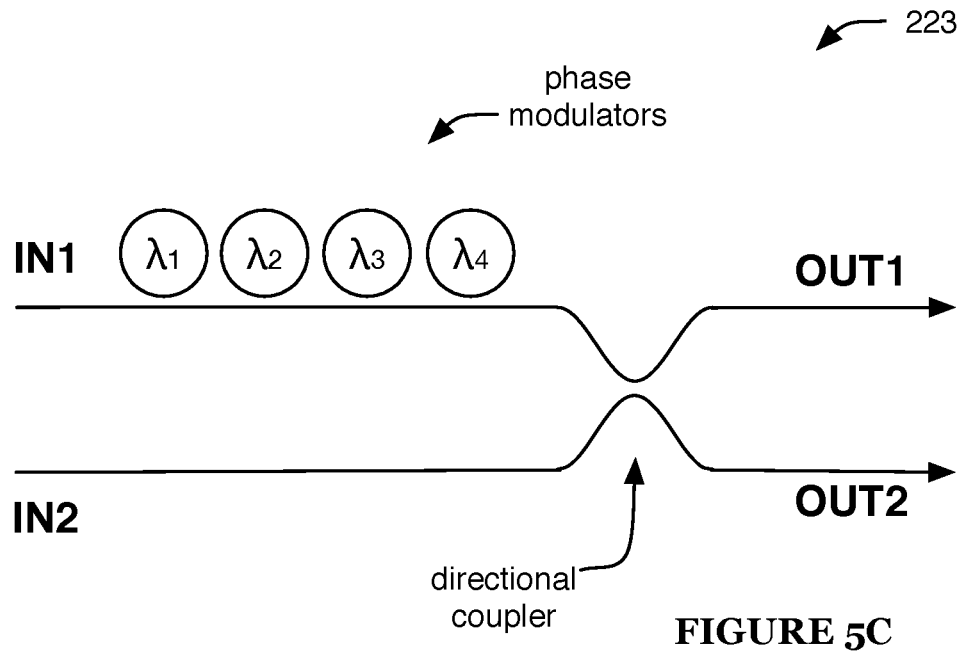
Figure 5D:
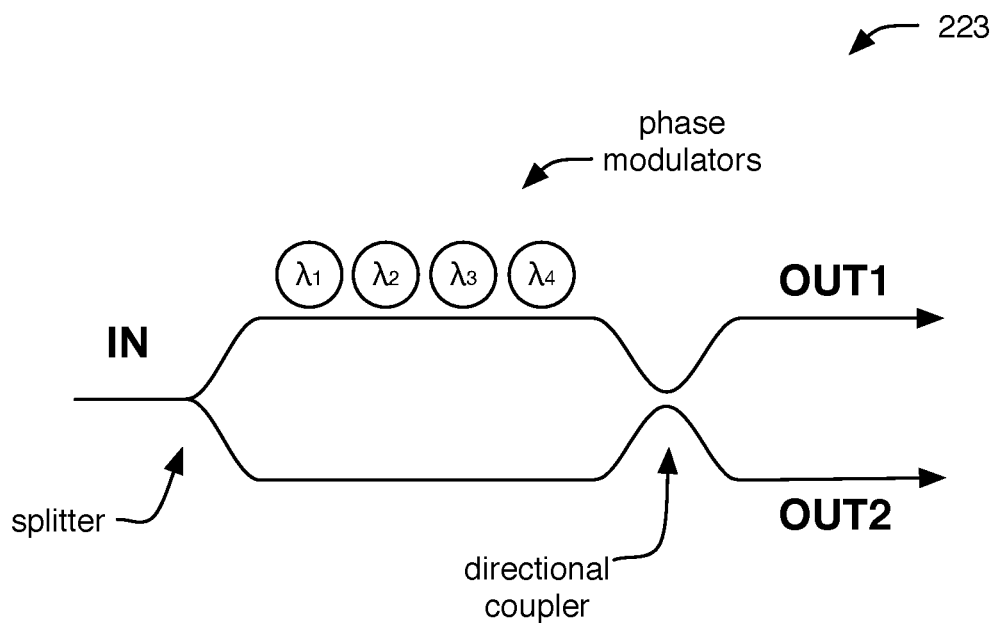

The set of input modulators 221 preferably functions to modulate the light source based on the multiplicands. The set preferably includes a plurality of input modulators (e.g., n input modulators, one for each multiplicand). The set of input modulators preferably receives the light source, and each modulator preferably receives one of the multiplicands (e.g., as an electrical control signal). The modulators are preferably channel-specific modulators (e.g., wherein each modulator is configured to modulate the light of a single channel of the optical source), such as wavelength-selective modulators (e.g., substantially modulating only a narrow wavelength band, such as substantially modulating only light of a single channel, such as shown by way of example in FIG. 4). Accordingly, the set of input modulators can generate an optical channel-division multiplexed (e.g., wavelength-division multiplexed and/or mode-division multiplexed, etc.) input signal. However, the modulators can additionally or alternatively include wideband modulators and/or modulators having any other suitable wavelength dependence.

Preferably, the set of input modulators cooperatively define an input modulator bank (e.g., as described in Appendix A regarding filter banks). The modulator banks can include amplitude-based modulator banks, phase-based modulator banks, and/or any other suitable modulator banks. In some examples, the set of input modulators 221 includes one or more optical modulators such as described in Appendix A, but can additionally or alternatively include any other suitable optical modulators, and/or include any other suitable modulators and/or other elements, in any suitable arrangement.

The splitter 222 preferably functions to split the input signal (received from the set of input modulators 221) onto a plurality of spatially-separated paths (e.g., waveguides). The splitter is preferably an nk-way splitter (e.g., producing nk different copies of the input signal), but can alternatively split the input signal onto any other suitable number of paths. In some examples, the splitter may split the input signal onto a number of paths equal to an integer multiple of nk (e.g., 2nk in examples in which the multiplication banks are phase-based multiplication banks); alternatively, in examples in which only a subset of multiplication banks are phase-based, the splitter may split the input signal onto a sufficient number of paths to provide one path to each amplitude-based multiplication bank and two paths to each phase-based multiplication bank.

The splitter is preferably channel-independent (or substantially channel-independent), wherein light of each channel is distributed between the output paths in a substantially identical manner. Alternatively, different channel-specific (e.g., wavelength-selective) elements can be used to split each channel (or set of multiple channels, such as adjacent channels) independently. The signal is preferably split equally (or substantially equally) between all paths and/or spectral filter banks, but can alternatively be split with any other suitable intensity distribution.

In alternate embodiments, in which an MM includes multiple sets of input modulators (e.g., each configured to receive and modulate an optical source, preferably wherein each set of input modulators of the MM produces a substantially identical input signal as the others), the MM can include multiple splitters 222 (e.g., one for each input modulator) or can omit the splitter 222. In a first example (e.g., in which the MM includes fewer than nk input modulators, such as including p input modulators wherein p<nk), the MM includes one splitter 222 to receive an input signal from each of the input modulators (e.g., p splitters for the p input modulators), and each splitter splits its respective input signal onto fewer than nk paths (preferably wherein the total number of paths from all the splitters of the MM is equal to nk, thereby generating one path for each of the nk multiplication banks); in a specific example, in which nk/p=q is an integer, each of the p input modulators provides its input signal to a different q-way splitter, and the q different paths from each splitter are provided to q different multiplication banks. In a second example (e.g., in which the MM includes at least nk sets of input modulators), the MM does not include a splitter, and each set of input modulators provides its respective input signal to a different multiplication bank. In a third example, some sets of input modulators generate input signals that are provided directly to a multiplication bank (e.g., as described regarding the second example), whereas other sets of input modulators generate input signals that are provided to a splitter (e.g., as described regarding the first example).

In some examples, the splitter 222 can be (and/or include elements of) the splitter described in Appendix A. However, the multiplication module can additionally or alternatively include any other suitable splitter.

The multiplication banks 223 (e.g., weight banks) preferably function to perform analog multiplications of multipliers with the input signal. The multiplication module preferably includes nk separate multiplication banks, but can alternatively include any other suitable number of multiplication banks. Each multiplication bank preferably filters (e.g., filters in a substantially time-independent manner; switches, such as at a low rate; modulates at a high rate, such as comparable to the bandwidth of the input optical signal and/or the modulation rate of the modulators of the input signal; otherwise controls; etc.) an optical signal (e.g., the input signal) based on a data signal (e.g., the weights or other multiplier values). Each multiplication bank preferably receives an optical signal from the splitter (e.g., modulated optical signal), receives a subset of the multiplier values (e.g., n multiplier values, corresponding to the n channels of the modulated signal, wherein each channel of the modulated signal is representative of a different multiplicand), and generates one of the spatially-separated optical outputs based on the modulated signal and the multiplier values.

In some examples, the multiplication banks 223 can be (and/or include elements of) the filter banks described in Appendix A (e.g., as shown in FIGS. 5A-5D). However, the multiplication module can additionally or alternatively include any other suitable multiplication banks.

However, the system can additionally or alternatively include any other suitable multiplication modules.

3.3 Summation Modules.

The summation modules 230 preferably function to perform summation of values computed by the multiplication modules 220. Each summation module 230 preferably receives input (e.g., a multiplication module output) from multiple multiplication modules (preferably all of the multiplication modules), and preferably computes the sum of all channels of all the received outputs.

Figure 6A:
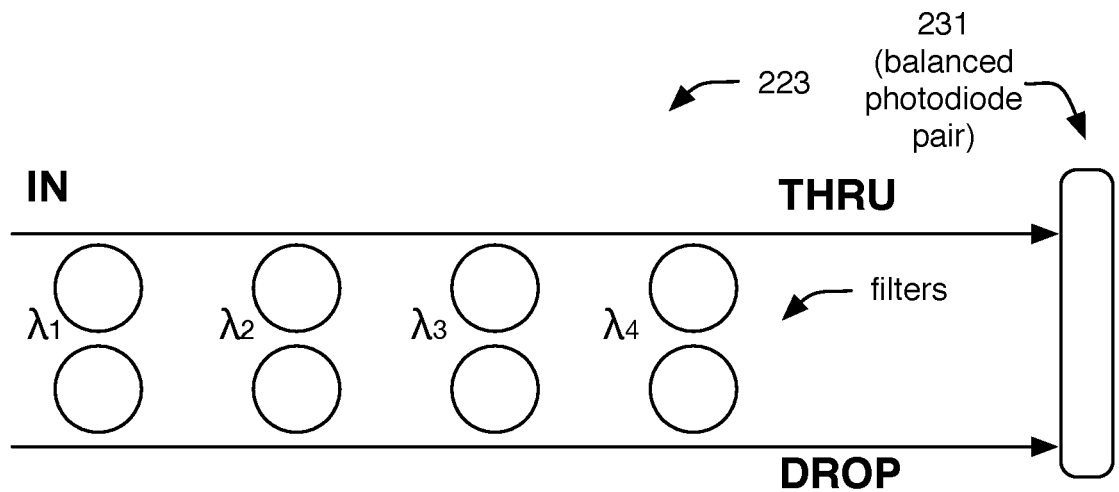
FIGS. 6A-6E are schematic representations of various examples of a portion of the system.
Figure 6B:
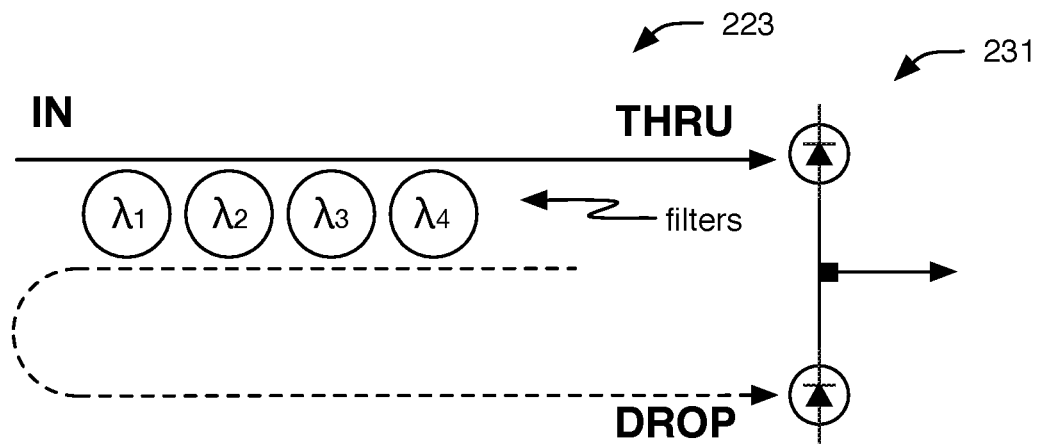
Figure 6C:
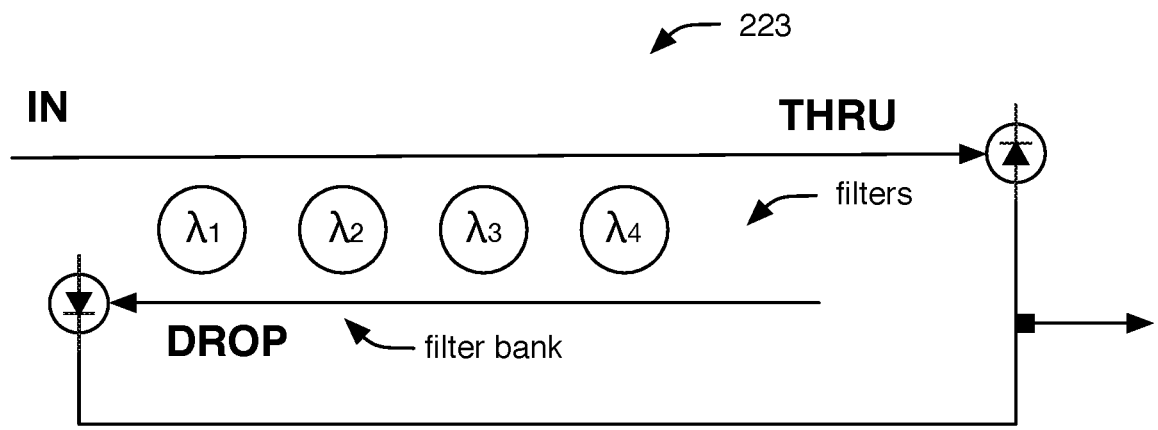
Figure 6D:
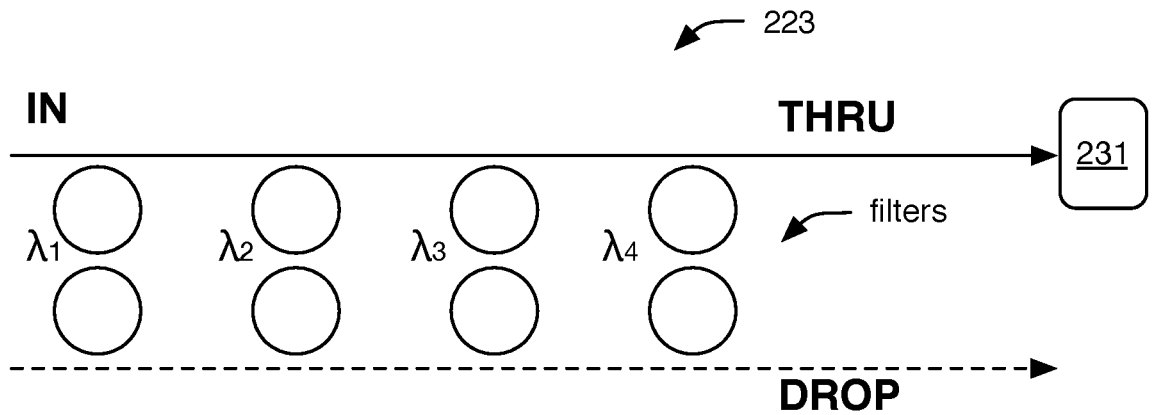
Figure 6E:
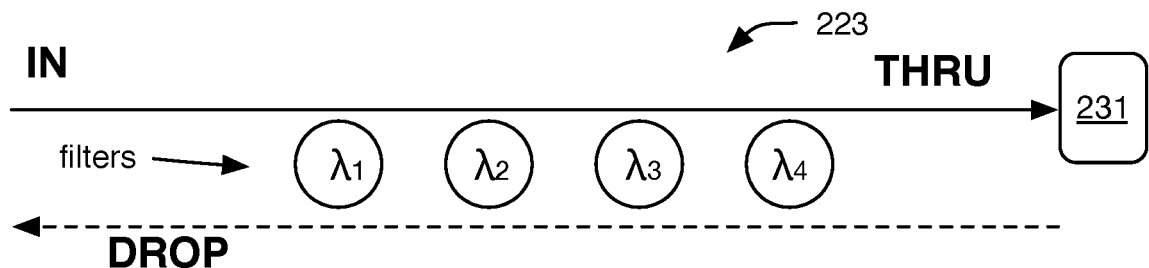

Each summation module 230 can include one or more detectors 231, which each preferably function to transduce one or more optical signals (e.g., into an electrical signal). Each detector can sum values (e.g., channel-specific values), such as intensity values, from one or more of the received outputs (e.g., optical outputs). The detectors preferably include one or more photodetectors (e.g., photodiodes), but can additionally or alternatively include any other suitable detectors. In a first embodiment, each detector includes a pair of photodiodes (e.g., balanced photodetector), such as one each receiving an optical input from the THRU and DROP ports of the spectral filter bank (e.g., as shown in FIGS. 6A-6C). In a second example, the detector is a single photodiode (e.g., receiving an optical input from either the THRU or the DROP port, such as shown by way of examples in FIGS. 6D-6E). However, the detector can additionally or alternatively include any other suitable arrangement of photodiodes and/or other detectors. Each detector output and/or derivatives thereof, such as combinations of detector outputs (e.g., sums or differences of multiple detector outputs) can be provided (e.g., as an electrical signal) to one or more other computation, control, and/or memory elements (e.g., electronic computing elements such as processors and/or RAM). However, one or more detector outputs can additionally or alternatively be used to drive one or more transducers (e.g., transducers of the same input module, of another input module, etc.). However, the summation module can additionally or alternatively include any other suitable detectors.

The summation module can combine summation module inputs (e.g., multiplication module outputs) in the optical and/or electrical domain. In examples, the summation module can combine outputs (summation module inputs) using any of the following example structures (and/or combinations thereof).

Figure 7A:
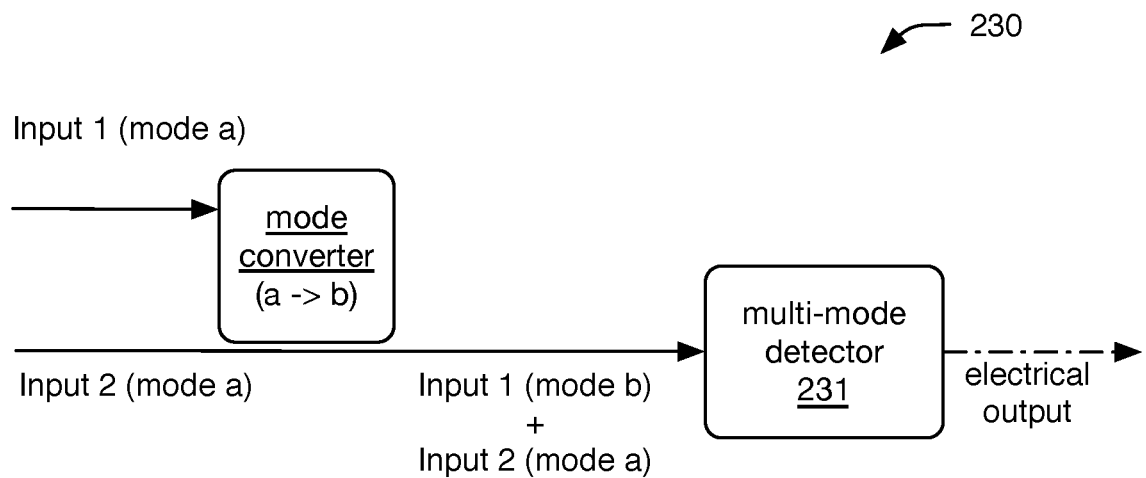
FIGS. 7A-7B are schematic representations of a first example of a summation module and a specific example of the first example, respectively.
Figure 7B:
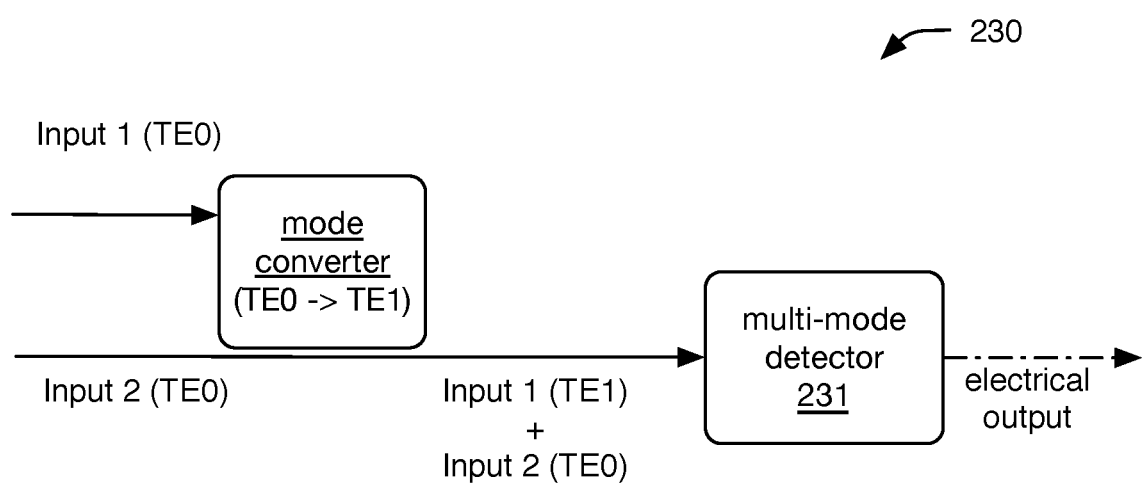

In a first example, some or all of the outputs can be combined optically, such as by coupling multiple outputs into a single waveguide (e.g., as shown in FIGS. 7A-7B, wherein two multiplication module outputs/summation module inputs are denoted as "Input 1" and "Input 2"). When outputs are combined optically, interference (e.g., constructive and/or destructive interference) can occur between light signals of the same channel (e.g., due to phase differences between the optical signals). Accordingly, the optical signals are preferably transformed onto different channels before optical combination. This can be achieved, for example, using different spatial modes (e.g., higher-order TE modes, such as wherein the optical signals are originally in the $TE_0$ mode) and/or polarizations (e.g., TE and TM modes); in such examples, the waveguide into which the multiple outputs of different spatial modes are coupled is preferably a multi-mode waveguide (e.g., waveguide configured to support all of the outputs to be coupled into it, such as a few-mode waveguide preferably configured to support only the mode-based channels used in the outputs).

In some examples, one or more outputs can be transformed to a different mode before combination with the other output(s). In a specific example (e.g., as shown in FIGS. 7A-7B), a first output is converted (e.g., by a mode converter) from a first spatial mode (e.g., $TE_0$) to a second spatial mode (e.g., $TE_1$), and then combined with a second output (e.g., which is in the first spatial mode). This combined signal, including light of different modes, is preferably provided (e.g., by propagation along the multi-mode waveguide) to a multi-mode detector (e.g., to enable detection of light of all channels, including channels transformed onto different modes).

Figure 7C:
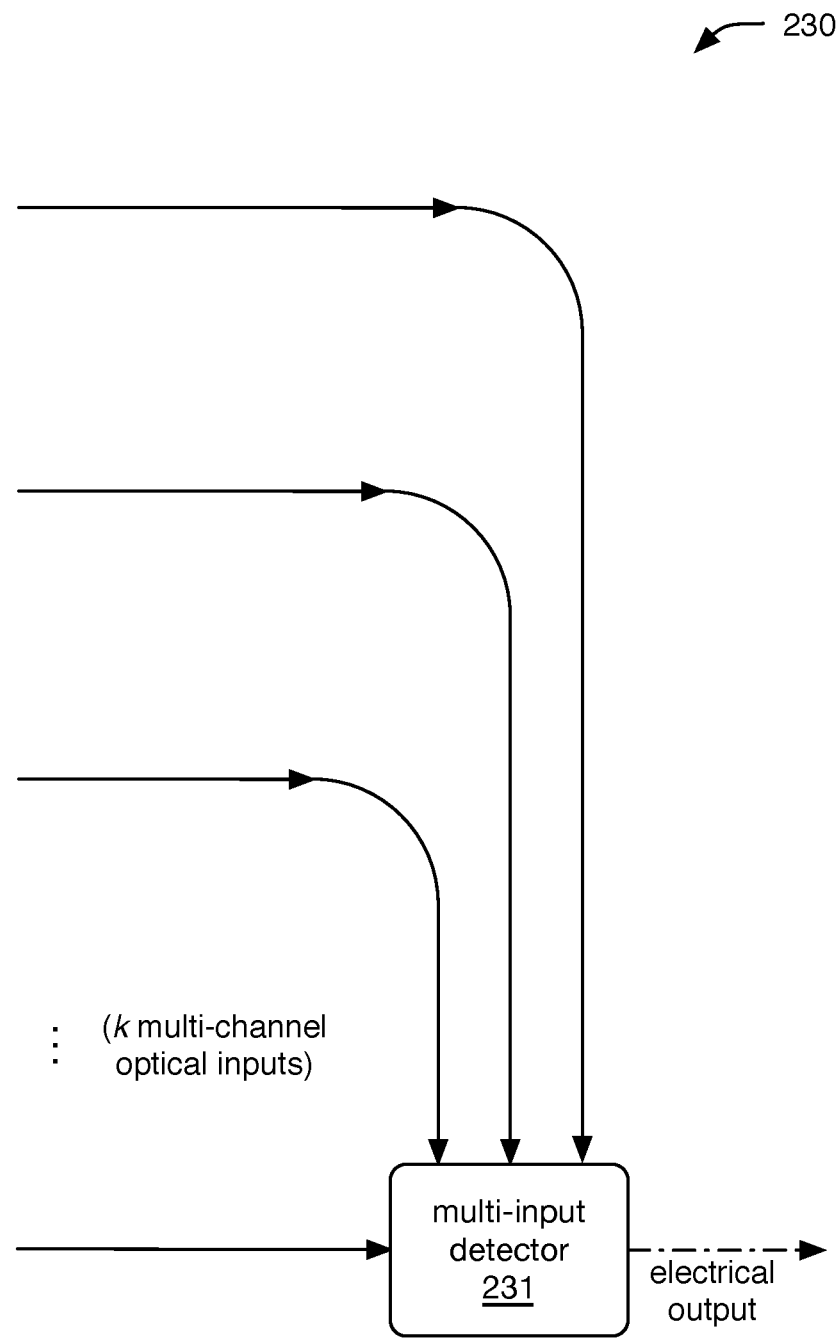
FIGS. 7C-7E are schematic representations of various examples of a summation module.

In a second example, some or all of the optical signals are combined at a detector (e.g., as shown in FIG. 7C). For example, the detector can be a photodetector configured to accept multiple inputs (e.g., spatially-separated inputs). By providing multiple received outputs to such a photodetector, the sum of the outputs can be generated by the photodetector.

Figure 7D:
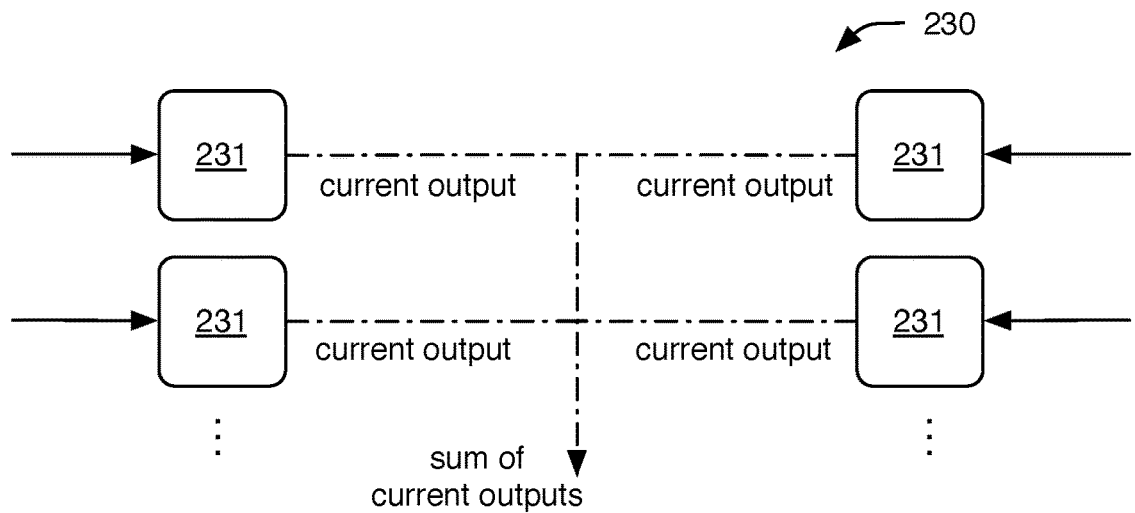
Figure 7E:
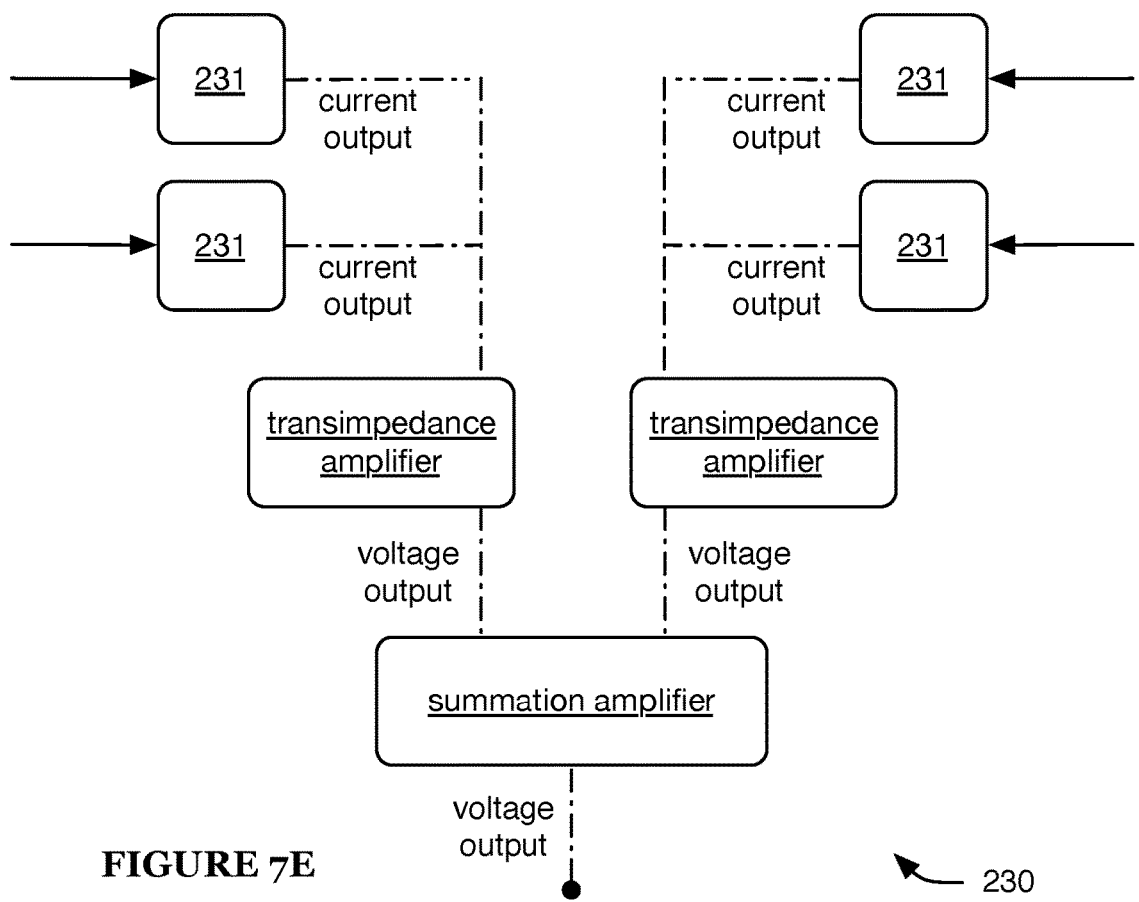
Figure 7F:
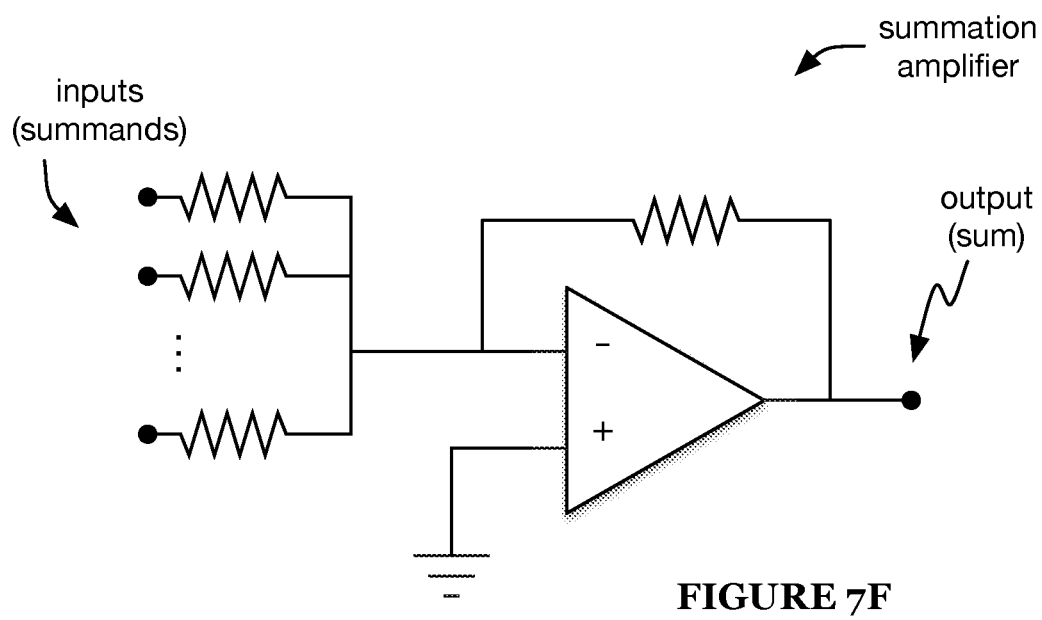
FIG. 7F is a schematic representation of an example of a summation amplifier.

In a third example, some or all outputs can be combined after the detectors (e.g., in the electrical domain). In a first specific example, the photodetector currents can be summed directly (e.g., wherein the detectors are arranged in series, such as shown by way of examples in FIGS. 7D-7E). In this specific example, the lead length of the detector outputs is preferably minimized, such as in order to achieve low summation module capacitance. In a second specific example, the outputs can be summed in the voltage domain (e.g., wherein the current outputs are provided to one or more transimpedance amplifiers, summation amplifiers, etc.), such as shown by way of example in FIG. 7E; a specific example of a summation amplifier is shown in FIG. 7F.

In such examples, the optical signal paths can include waveguide crossings, elevator waveguides, and/or any other suitable elements for routing optical signals to and/or within the summation module. However, the summation module 230 can additionally or alternatively include any other suitable elements in any suitable arrangement. Further, the system 200 can additionally or alternatively include any other suitable elements in any suitable arrangement.

4. Method.

The method 300 for photonic computation preferably functions to multiply a multiplicand vector (e.g., activation vector) by a multiplier matrix (e.g., weight matrix) to produce an output vector. The method 300 is preferably implemented using the system 200 described above, but can additionally or alternatively be implemented using any other suitable system(s).

In some embodiments, the method 200 includes one or more elements such as described in U.S. Pat. No. 8,027,587, issued 27 Sep. 2011 and titled "Integrated Optic Vector-Matrix Multiplier", and/or in U.S. Pat. No. 10,656,336, issued 16 May 2020 and titled "Method for Phase-Based Photonic Computing", each of which is hereby incorporated in its entirety by this reference (e.g., using the system 100 described herein to implement elements of the functionality of U.S. Pat. No. 8,027,587 and/or elements of the method of U.S. Pat. No. 10,656,336). However, the method can additionally or alternatively include any other suitable elements.

4.1 Generating Input Signals.

Generating input signals S310 preferably includes receiving optical sources (e.g., multi-channel optical sources, such as described above in more detail) and modulating the received optical sources. In some embodiments, each MM receives an optical source and independently modulates it (e.g., at the set of input modulators). The input signals are preferably generated substantially concurrently, but can additionally or alternatively be generated with any other suitable timing. Each input signal is preferably modulated such that it is representative of a subset of a multiplicand vector, more preferably wherein each channel of the input signal is representative of a different element (multiplicand value) of the multiplicand vector (e.g., as described above in more detail, such as regarding the sets of input modulators 221). Collectively, the input signals preferably partition the set of elements of the multiplicand vector, more preferably wherein each input signal is representative of the same number of elements (e.g., equal to the number of channels in the optical signals, n). For example, in a system in which n=64 channels are used (e.g., the optical sources include light of the 64 different channels, each modulator/filter bank can independently control 64 different channels, etc.) and the system includes k=4 MMs, a 256-element multiplicand vector can be partitioned into four different 64-element vectors, each represented by one of the four input signals that are generated substantially concurrently (e.g., a first vector including elements 1-64, a second vector including elements 65-128, a third vector including elements 129-192, and a fourth vector including elements 193-256).

Generating input signals S310 can optionally include splitting the input signals (e.g., signals modulated as described above) onto a plurality of paths. Preferably, the input signals are split such that each multiplication bank receives an input signal. For example, the input signal from an input modulator bank can be split nk ways to provide a separate input signal (e.g., substantially identical to all other input signals within the MM) to each multiplication bank of the MM. Alternatively, the input signals can be split (or not split) in any other suitable manner (e.g., manners described above in more details, such as regarding the splitter 222).

However, S310 can additionally or alternatively include generating the input signals in any other suitable manner.

The method 300 preferably includes repeating S310, which can function to enable rapid computation based on many different input signals. S310 is preferably repeated substantially periodically. In some examples, S310 is repeated at a rate of 20 GS/s (e.g., 20 billion different input signals per second), 10 GS/s, 5 GS/s, 2.5 GS/s, 1 GS/s, 500 MS/s, 250 MS/s, 100 MS/s, 50 MS/s, 25 MS/s, 10 MS/s, 5 MS/s, 2.5 MS/s, 1 MS/s, 500 kS/s, 250 kS/s, 100 kS/s, 50 kS/s, 10-100 kS/s, 100-1000 kS/s, 1-10 MS/s, 10-50 MS/s, 50-200 MS/s, 200-500 MS/s, 0.5-2 GS/s, 2-8 GS/s, 8-32 GS/s, and/or any other suitable rate. However, S310 can additionally or alternatively be repeated with any other suitable timing, or can be performed only once.

4.2 Computing Products.

Computing products S320 preferably includes receiving control signals (e.g., electrical control signals, such as analog electrical inputs and/or digital electronic signals), receiving input signals (e.g., the optical input signals generated in S310), and generating filtered signals by filtering the input signals based on the control signals. Each multiplication bank preferably receives a control signal associated with (e.g., representative of) a subset of a multiplier matrix, more preferably a subset of a single vector, such as row or column vector, of the multiplier matrix. Cooperatively, the multiplication banks of an MM can be controlled based on control signals representative of a sub-matrix of the multiplier matrix (e.g., for an nk×nk multiplier matrix, each MM can be associated with an n×nk sub-matrix, wherein each multiplication bank is associated with an n-element vector of its MM's sub-matrix). For example, the control signal can include a different portion associated with (e.g., representative of) each element of the subset. In a specific example, each filter element of the multiplication bank is associated with a different optical channel, and the filter element is controlled to filter the associated optical channel based on a portion of the control signal, representative of a multiplier value associated with the optical channel, that is provided to the filter element.

In response to light propagation (e.g., of the input signal) through the multiplication bank, the filter elements of the multiplication bank preferably filter (e.g., attenuate; phase shift, such as to effect or prevent an attenuation due to interference; etc.) the light based on the control signal (e.g., as described above in more detail, such as regarding the multiplication banks 223). Each channel of the input signal is preferably attenuated by a factor substantially equal to the corresponding multiplier value, thereby computing a product of the multiplier value with the multiplicand value represented by the light of that channel. For example, in a system in which n=64 channels are used, a multiplication bank preferably receives a control signal associated with each of the 64 channels, corresponding to 64 different multiplier values. In this example, the multiplication bank preferably filters (e.g., attenuates) each of the 64 channels of the input signal based on the corresponding multiplier value.

S320 is preferably performed in response to S310 (e.g., automatically in response to S310, preferably as a consequence of input signal propagation through the multiplier banks). S320 can be performed based on the same multiplier values (e.g., based on the same control signals) for many repetitions of S310 (e.g., wherein the different multiplicand vectors are each multiplied by the same multiplier values). However, the method 300 can additionally or alternatively include altering the multiplier values between some (or all) performances of S320. For example, the method can include performing S320 based on a first multiplier matrix for a first set of repetitions (e.g., wherein the same control signals are used for each repetition of the first set), and then performing S320 based on a second multiplier matrix for a second set of repetitions (e.g., wherein the same control signals, different from the control signals used in the first set, are used for each repetition of the second set). Additionally or alternatively, S320 can be performed based on different multiplier values for each repetition, and can optionally be performed on substantially identical input signals in the different repetitions (e.g., wherein the multiplier matrix changes and the multiplicand vector remains constant).

However, S320 can additionally or alternatively include computing products in any other suitable manner.

4.3 Computing Sums.

Computing sums S330 preferably includes receiving signals (e.g., optical signals) representative of the products computed in S320 (e.g., the filtered signals generated in S320) and generating signals (e.g., electrical signals) representative of sums of the received products. Each SM preferably receives a filtered signal from each of the MMs (e.g., wherein each multiplication bank of an MM outputs a filtered signal to a different SM), such that it receives k total filtered signals (e.g., wherein each filtered signal is representative of n different products), more preferably wherein the filtered signals are received substantially concurrently. In response to receiving the filtered signals, the SM preferably transduces the filtered signals into an electrical signal representative of the sum of each of the products represented by the channels of the filtered signals (e.g., as described above in more detail, such as regarding the summation modules 230). For example, a photodetector of an SM can receive one or more filtered signals, and can output an electrical current substantially proportional to a total light intensity of the filtered signals (e.g., substantially proportional to a sum of the intensities of each channel of the filtered signals). Additionally or alternatively, the SM can compute sums in the electrical domain (e.g., by combining currents from multiple photodetectors in series, by adding voltages transduced from photodetector currents, etc.) and/or in any other suitable manner.

The sums (e.g., signals indicative and/or representative of the sums, such as the transduced electrical signals) can be provided to electronic computing elements (e.g., electronic processors, memory, etc.), provided to photonic computing elements (e.g., provided as electrical and/or optical inputs to elements such as the input modulators, multiplication banks, other elements of the MMs, and/or any other suitable elements of a photonic computing system), and/or used in any other suitable manner. In a first example, the sums are provided (e.g., as electronic signals, such as analog or digital electronic signals) to the input modulators (and new control signals are optionally provided to the multiplication banks), in order to enable performance of S310, S320, and S330 using the sums as new multiplicands. In a second example, the sums are provided to one or more electronic computing elements (e.g., wherein the sums and/or derivatives thereof are stored in memory and/or used to determine new input/control signals for the photonic computing elements). However, the sums can additionally or alternatively be used in any other suitable manner.

S330 is preferably performed in response to S320 (e.g., automatically in response, preferably as a consequence of filtered signal propagation to the SMs). However, S330 can additionally or alternatively be performed with any other suitable timing, and/or can include computing sums in any other suitable manner.

Although omitted for conciseness, the preferred embodiments include every combination and permutation of the various system components and the various method processes. Furthermore, various processes of the preferred method can be embodied and/or implemented at least in part as a machine configured to receive a computer-readable medium storing computer-readable instructions. The instructions are preferably executed by computer-executable components preferably integrated with the system. The computer-readable medium can be stored on any suitable computer readable media such as RAMs, ROMs, flash memory, EEPROMs, optical devices (CD or DVD), hard drives, floppy drives, or any suitable device. The computer-executable component is preferably a general or application specific processing subsystem, but any suitable dedicated hardware device or hardware/firmware combination device can additionally or alternatively execute the instructions.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A method for photonic computing comprising, at a photonic computing system comprising a first plurality of multiplication modules (MMs) and a second plurality of summation modules (SMs), each MM of the first plurality comprising a respective plurality of multiplication banks:
   for each MM of the first plurality, at the MM:
      for each multiplication bank of the respective plurality, at the multiplication bank, receiving a respective control signal representative of a respective plurality of multiplier values;
      generating a respective plurality of optical input signals, each optical input signal comprising input signal light within each of a plurality of optical channels, wherein the input signal light of each optical channel of the plurality is representative of a respective multiplicand value; and
      for each optical input signal of the respective plurality:
         providing the optical input signal to a respective multiplication bank of the MM;
         at the respective multiplication bank, generating a filtered signal by filtering the optical input signal based on the control signal, the filtered signal comprising filtered light within each of the plurality of optical channels; wherein, for each optical channel of the plurality, the filtered light within the optical channel is representative of a respective product of: a multiplier value of the respective plurality and the respective multiplicand value associated with the input signal light within the optical channel; and
         providing the filtered signal to a respective SM of the second plurality; and
   for each SM of the second plurality, at the SM:
      receiving a respective plurality of filtered signals, comprising, for each MM of the first plurality, receiving, from the MM, a respective filtered signal of the respective plurality; and
      based on the respective plurality of filtered signals, generating a respective sum electrical signal representative of a sum of each respective product of each filtered signal of the respective plurality.

2. The method of claim 1, further comprising:
   generating a multi-channel optical source comprising substantially unmodulated light within each optical channel of the plurality;
   splitting the multi-channel optical source onto a plurality of source paths, each source path optically coupled to a different MM of the first plurality; and
   for each MM of the first plurality, at an input modulator bank of the MM, receiving the multi-channel optical source via a source path of the plurality, wherein generating the respective plurality of optical input signals comprises, at the input modulator bank, modulating the multi-channel optical source.

3. The method of claim 2, wherein generating the respective plurality of optical input signals further comprises, after modulating the multi-channel optical source, splitting the modulated multi-channel optical source into the respective plurality of optical input signals, wherein each optical input signal of the respective plurality is substantially identical.

4. The method of claim 1, wherein:
the plurality of optical channels consists of n optical channels, wherein n is a first integer;
the first plurality of MMs consists of k MMs, wherein k is a second integer;
for each MM, the respective plurality of multiplication banks consists of nk multiplication banks, wherein nk is the product of n and k; and
the second plurality of SMs consists of nk SMs.

5. The method of claim 4, wherein:
n is equal to or greater than 16; and
k is equal to or greater than 4.

6. The method of claim 4, wherein, for each multiplication bank of the photonic computing system:
the multiplication bank comprises n optical filters, wherein each optical filter of the n optical filters is associated with a different optical channel of the plurality;
the respective plurality of multiplier values comprises n multiplier values, wherein each multiplier value of the respective plurality is associated with a different optical channel of the plurality; and
filtering the input signal based on the respective control signal comprises, for each optical channel of the plurality, controlling the associated optical filter based on the associated multiplier value, wherein the multiplication bank attenuates the intensity of the input signal light within the optical channel by a factor substantially equal to the associated multiplier value.

7. The method of claim 6, wherein, for each multiplication bank of the photonic computing system, each optical filter of the multiplication bank comprises a microresonator.

8. The method of claim 1, wherein, for each optical channel of each filtered signal, an optical intensity of the filtered light within the optical channel is substantially proportional to the respective product.

9. The method of claim 1, wherein the optical channels of the plurality are delimited based on spatial mode, wherein each optical input signal and each filtered signal is mode-division multiplexed.

10. The method of claim 1, wherein the optical channels of the plurality are delimited based on wavelength, wherein each optical input signal and each filtered signal is wavelength-division multiplexed.

11. The method of claim 10, wherein each optical channel of the plurality is associated with a first spatial mode, wherein, for each SM of the second plurality, generating the respective sum electrical signal comprises:
receiving a first and a second filtered signal of the respective plurality;
converting the first filtered signal from the first spatial mode to a second spatial mode;
generating a combined optical signal on a multi-mode waveguide of the SM, comprising, after converting the first filtered signal, optically coupling the first and second filtered signals to the multi-mode waveguide, wherein the combined optical signal comprises light of a different optical channel for each optical channel of the first filtered signal and for each optical channel of the second filtered signal;
at a multi-mode photodetector of the SM, receiving the combined optical signal via the multi-mode waveguide; and
at the multi-mode photodetector, transducing the combined optical signal into a first electrical signal, wherein an electrical characteristic of the first electrical signal is substantially proportional to a sum of optical intensities of the light of each optical channel of the combined optical signal.

12. The method of claim 1, wherein the optical channels of the plurality are further delimited based on spatial mode, wherein each optical input signal and each filtered signal is mode-division multiplexed.

13. The method of claim 1, wherein, for each SM of the second plurality, generating the respective sum electrical signal comprises, at a photodetector of the SM:
receiving a plurality of filtered signals of the respective plurality substantially concurrently, comprising:
receiving, via a first waveguide, a first filtered signal; and
receiving, via a second waveguide, a second filtered signal; and
transducing the plurality of filtered signals into a first electrical signal, wherein an electrical characteristic of the first electrical signal is substantially proportional to a sum of optical intensities of the filtered light of each optical channel of each filtered signal of the plurality.

14. The method of claim 1, wherein, for each SM of the second plurality, generating the respective sum electrical signal comprises:
at a first photodetector of the SM, receiving a first filtered signal of the respective plurality;
at the first photodetector, transducing the first filtered signal into a first electrical signal, wherein a first electrical characteristic of the first electrical signal is proportional to a first summand;
substantially concurrent with receiving the first filtered signal, at a second photodetector of the SM, receiving a second filtered signal of the respective plurality;
at the second photodetector, transducing the second filtered signal into a second electrical signal, wherein a first electrical characteristic of the second electrical signal is proportional to a second summand; and
at a summation circuit of the SM, generating a third electrical signal based on the first and second filtered signals, wherein a second electrical characteristic of the third electrical signal is proportional to a sum of the first and second summands.

15. The method of claim 14, wherein:
the first electrical characteristic is an electrical current metric;
the second electrical characteristic is the electrical current metric; and
the summation circuit comprises a series connection of a first photodetector output and a second photodetector output.

16. The method of claim 14, wherein:
the first electrical characteristic is an electrical current metric;
the second electrical characteristic is an electrical voltage metric; and
the summation circuit comprises:
a first transimpedance amplifier that generates a first voltage output based on the first electrical signal;
a second transimpedance amplifier that generates a second voltage output based on the second electrical signal; and a summation amplifier that generates the third electrical signal based on the first and second voltage outputs.

17. The method of claim 1, further comprising, after generating the respective plurality of optical input signals:
for each MM of the first plurality, at the MM:
generating a respective second plurality of optical input signals, wherein each optical input signal of the respective second plurality is different from each optical input signal of the respective plurality; and
for each multiplication bank of the MM:
providing a respective optical input signal of the respective second plurality to the multiplication bank; and
at the multiplication bank, generating a second filtered signal by filtering the respective optical input signal based on the control signal;
for each SM of the second plurality, at the SM:
receiving a respective second plurality of filtered signals, comprising, for each MM of the first plurality, receiving, from the MM, a respective filtered signal of the respective second plurality; and
based on the respective second plurality of filtered signals, generating a respective second electrical signal.

18. The method of claim 17, further comprising, after generating the respective second plurality of optical input signals:
for each MM of the first plurality, at the MM:
for each multiplication bank of the respective plurality, at the multiplication bank, receiving a respective second control signal representative of a respective second plurality of multiplier values;
generating a respective third plurality of optical input signals; and
for each multiplication bank of the MM:
providing a respective optical input signal of the respective third plurality to the multiplication bank; and
at the multiplication bank, generating a third filtered signal by filtering the respective optical input signal based on the second control signal;
for each SM of the second plurality, at the SM:
receiving a respective third plurality of filtered signals, comprising, for each MM of the first plurality, receiving, from the MM, a respective filtered signal of the respective third plurality; and
based on the respective third plurality of filtered signals, generating a respective third electrical signal.

19. A system for photonic computing comprising a first plurality of multiplication modules (MMs) and a second plurality of summation modules (SMs), wherein:
each MM of the first plurality comprises:
an input modulator bank that generates an optical input signal, wherein the optical input signal comprises input signal light within each of a plurality of optical channels;
an optical splitter that splits the optical input signal onto a plurality of input paths; and
a plurality of multiplication banks, each multiplication bank of the plurality optically coupled to a different SM of the second plurality by a respective output path, wherein each multiplication bank of the plurality:
receives the optical input signal via a respective input path of the plurality;
receives a respective electrical control signal representative of a respective plurality of multiplier values; and
generates a respective filtered signal by filtering the optical input signal based on the respective electrical control signal, wherein each optical channel is filtered based on a different multiplier value of the respective plurality; and
outputs the respective filtered signal to a SM of the second plurality;
each SM of the second plurality comprises a respective set of detectors, wherein, for each SM of the second plurality:
the set of detectors receives a respective plurality of filtered signals, the respective plurality of filtered signals comprising a different filtered signal received from each MM of the first plurality; and
based on the respective plurality of filtered signals, the SM generates a respective electrical signal representative of a sum of values represented by the respective plurality of filtered signals.

20. A method for photonic computing comprising:
at a first multiplication module (MM):
at a first multiplication bank of the first MM, receiving a first control signal representative of a first multiplier value;
at a second multiplication bank of the first MM, receiving a second control signal representative of a second multiplier value;
generating a first optical input signal, the first optical input signal comprising first input signal light of a first optical channel, wherein the first input signal light of the first optical channel is representative of a first multiplicand value;
splitting the first optical input signal into a plurality of portions comprising a first portion and a second portion;
at the first multiplication bank, receiving the first portion;
at the first multiplication bank, generating a first filtered signal by filtering the first portion based on the first control signal, the first filtered signal comprising first filtered light of the first optical channel, wherein the first filtered light of the first optical channel is representative of a first summand, wherein the first summand is substantially equal to a product of the first multiplier value and the first multiplicand value;
providing the first filtered signal to a first summation module (SM);
at the second multiplication bank, receiving the second portion;
at the second multiplication bank, generating a second filtered signal by filtering the second portion based on the second control signal, the second filtered signal comprising second filtered light of the first optical channel, wherein the second filtered light of the first optical channel is representative of a second summand, wherein the second summand is substantially equal to a product of the second multiplier value and the first multiplicand value; and
providing the second filtered signal to a second SM;
at a second multiplication module (MM):
at a third multiplication bank of the second MM, receiving a third control signal representative of a third multiplier value;

at a fourth multiplication bank of the first MM, receiving a fourth control signal representative of a fourth multiplier value;

generating a second optical input signal, the second optical input signal comprising second input signal light of the first optical channel, wherein the second input signal light of the first optical channel is representative of a second multiplicand value;

splitting the second optical input signal into a plurality of portions comprising a third portion and a fourth portion;

at the third multiplication bank, receiving the third portion;

at the third multiplication bank, generating a third filtered signal by filtering the third portion based on the third control signal, the third filtered signal comprising third filtered light of the first optical channel, wherein the third filtered light of the first optical channel is representative of a third summand, wherein the third summand is substantially equal to a product of the third multiplier value and the second multiplicand value;

providing the third filtered signal to the first SM;

at the fourth multiplication bank, receiving the fourth portion;

at the fourth multiplication bank, generating a fourth filtered signal by filtering the fourth portion based on the fourth control signal, the fourth filtered signal comprising fourth filtered light of the first optical channel, wherein the fourth filtered light of the first optical channel is representative of a fourth summand, wherein the fourth summand is substantially equal to a product of the fourth multiplier value and the second multiplicand value; and providing the fourth filtered signal to a second SM;

at the first SM:
  receiving a first plurality of filtered signals, the first plurality of filtered signals comprising the first filtered signal and the third filtered signal, wherein the first plurality of filtered signals is representative of a first plurality of summands comprising the first summand and the third summand; and
  based on the first plurality of filtered signals, generating a first electrical signal representative of sum of the first plurality of summands; and at the second SM;
  receiving a second plurality of filtered signals, the second plurality of filtered signals comprising the second filtered signal and the fourth filtered signal, wherein the second plurality of filtered signals is representative of a second plurality of summands comprising the second summand and the fourth summand; and
  based on the second plurality of filtered signals, generating a second electrical signal representative of a sum of the second plurality of summands.

* * * * *